(12) United States Patent
Wu et al.

(10) Patent No.: US 7,304,481 B2
(45) Date of Patent: Dec. 4, 2007

(54) APPARATUS FOR TESTING ELECTRIC CABLES

(75) Inventors: Sheng-Liang Wu, Shenzhen (CN); Ke-Sheng Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,695

(22) Filed: Apr. 22, 2006

(65) Prior Publication Data

US 2007/0046302 A1 Mar. 1, 2007

(30) Foreign Application Priority Data

Aug. 26, 2005 (CN) .................. 2005 1 0036908

(51) Int. Cl.
*G01R 31/02* (2006.01)
(52) U.S. Cl. .................. 324/539; 324/761; 324/540
(58) Field of Classification Search ............... 324/539, 324/538, 66, 540
See application file for complete search history.

(56) References Cited

U.S. PATENT DOCUMENTS 3,528,104 A * 9/1970 Ehlschlager ................ 324/539
3,609,538 A * 9/1971 Schag ........................ 324/66
4,443,755 A * 4/1984 Wooten ...................... 324/66
4,471,293 A * 9/1984 Schnack ..................... 324/540
4,563,636 A * 1/1986 Snook et al. ................ 324/66
4,736,158 A * 4/1988 McCartney .................. 324/66
5,027,074 A * 6/1991 Haferstat .................... 324/539
5,250,908 A * 10/1993 Liu et al. .................... 324/542
2005/0099186 A1* 5/2005 Parker et al. ............... 324/538

FOREIGN PATENT DOCUMENTS

CN 00200774.6 6/2001
GB 2234598 A * 2/1991

* cited by examiner

*Primary Examiner*—Anjan Deb
(74) *Attorney, Agent, or Firm*—Wei Te Chung

(57) ABSTRACT

In one preferred embodiment, an apparatus for testing a cable includes an interface for connecting to a connector of the cable, many resistors, a socket, and a meter for testing resistance of the resistors. The interface has many pins, the resistors respectively connected to the pins in series, and the socket is electrically connected to the pins respectively via the resistors. The meter includes two probes, one of the probes is connected to another connector of the cable, and the other one of the probes is plugged into the socket. Because conductors of the cable are respectively connected to the resistors in series, the user can tell whether the cable has a fault according to the resistance indicated by the meter.

8 Claims, 5 Drawing Sheets

APPARATUS FOR TESTING ELECTRIC CABLES

CROSS-REFERENCES TO RELATED APPLICATION

Relevant subject matter is disclosed in co-pending U.S. Patent Application entitled "Apparatus for Testing Cables" filed on Apr. 28, 2006 with application Ser. No. 11/308,742, and assigned to the same assignee with this application.

FIELD OF THE INVENTION

The present invention relates generally to test equipment and more specifically to an apparatus for testing cables used in electronic equipment.

DESCRIPTION OF RELATED ART

During the installation of or interconnection of various equipment in computers, it is necessary to make frequent wire checks verifying the integrity of connections made by means of cables utilized to interconnect various equipment. It is necessary that the cable be checked for a number of wire faults, such as opens and shorts between wires.

A number of test apparatuses or methods have been developed for making checks of cable for shorts and opens. One such method is to employ a multi-meter to test each conductor of the cable one by one. However, the multi-meter is only capable of indicating an open state.

What is desired, therefore, is an apparatus which can test for both opens and shorts in cables.

SUMMARY OF THE INVENTION

In one preferred embodiment, an apparatus for testing a cable comprises an interface for connecting to a connector of the cable, a plurality of resistors, a socket, and a meter for testing resistance of the resistors. The interface has a plurality of pins, the resistors respectively connected to the pins in series, and the socket is electrically connected to the pins respectively via the resistors. The meter includes two probes, one of the probes is connected to another connector of the cable, and the other one of the probes is plugged into the socket.

Other advantages and novel features will become more apparent from the following detailed description when taken in conjunction with the accompanying drawings, in which:

DETAILED DESCRIPTION OF THE INVENTION

Figure 1:
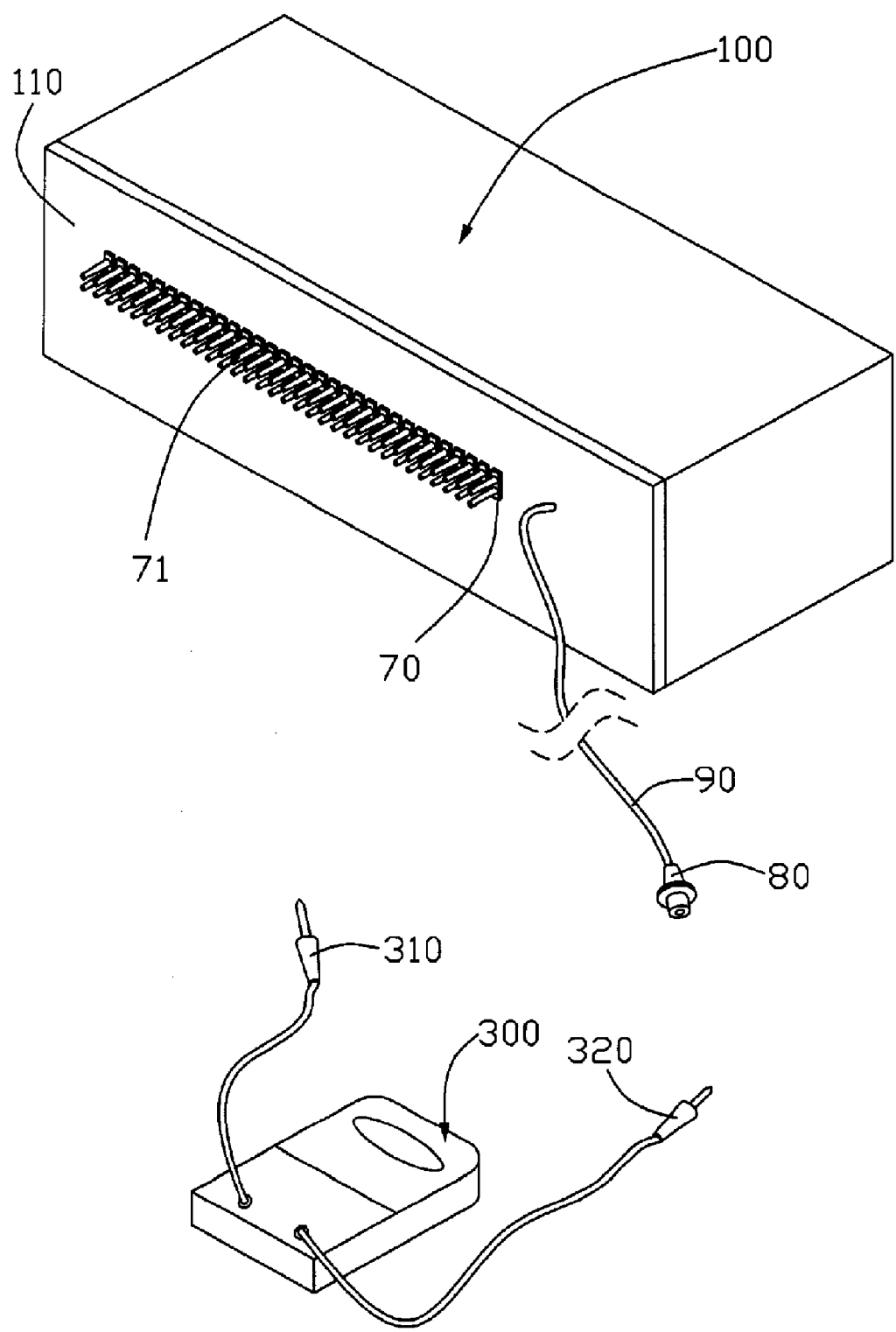
FIG. 1 is a schematic view of a testing apparatus of a preferred embodiment of the present invention, together with a multi-meter.
Figure 2:
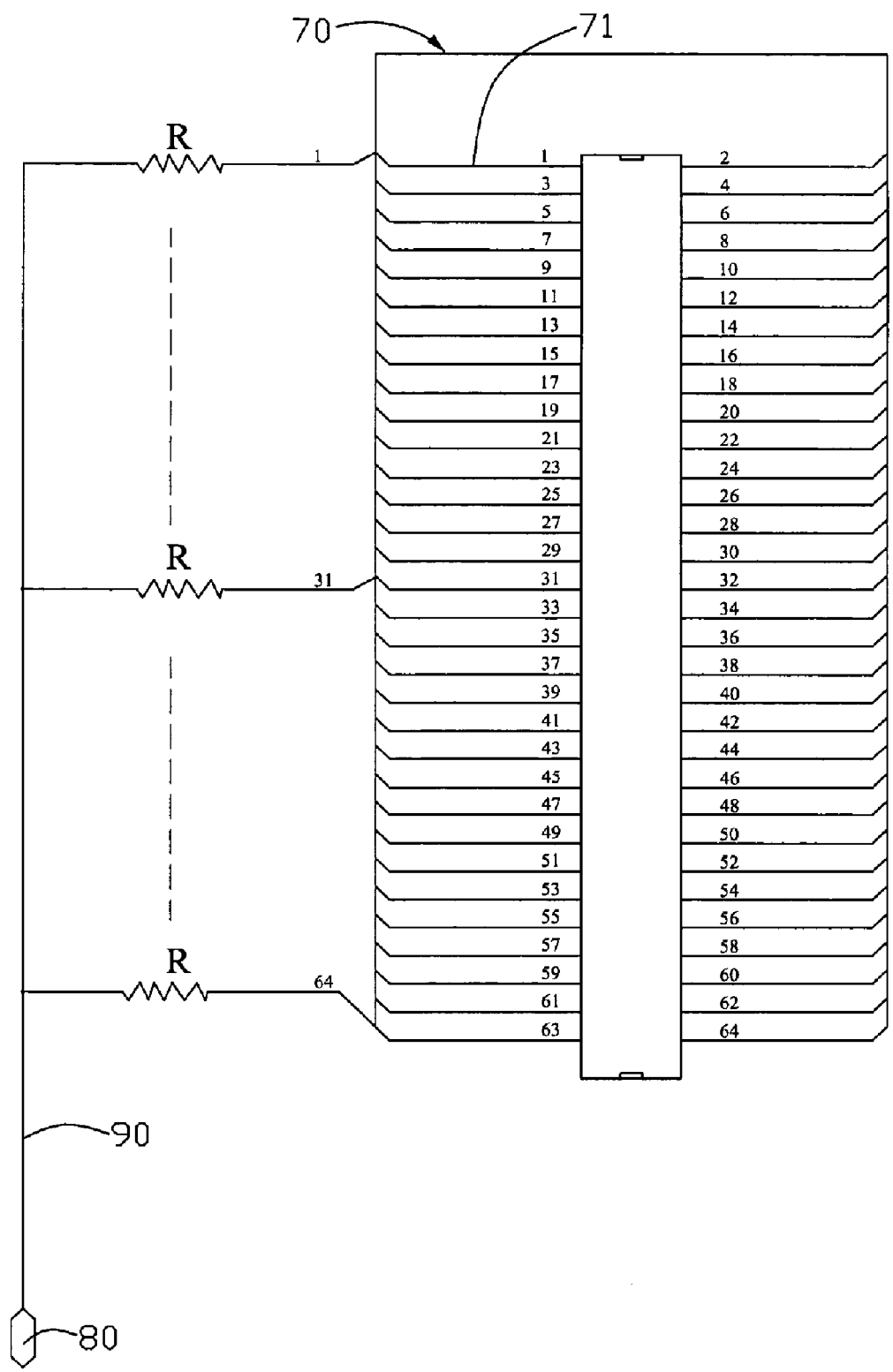
FIG. 2 is an internal circuit diagram of the testing apparatus of FIG. 1.

Referring to FIG. 1 and FIG. 2, an apparatus for testing cables includes a box 100 and a plurality of resistors in the box 100. The box 100 includes a panel 110. An interface 70 is defined on the panel 110. A line 90 passes through the panel 110 from an interior to an exterior of the box 100. The interface 70 includes a plurality of pins 71. Each of the pins 71 is connected to the line 90 respectively via one of the resistors R. A socket 80 is defined on an end of the line 90. In this embodiment, resistors having 10Ω resistance will be used as an example. The socket 80 is electrically connected to each of the pins 71 via the line 90 and the resistors R.

Figure 3:
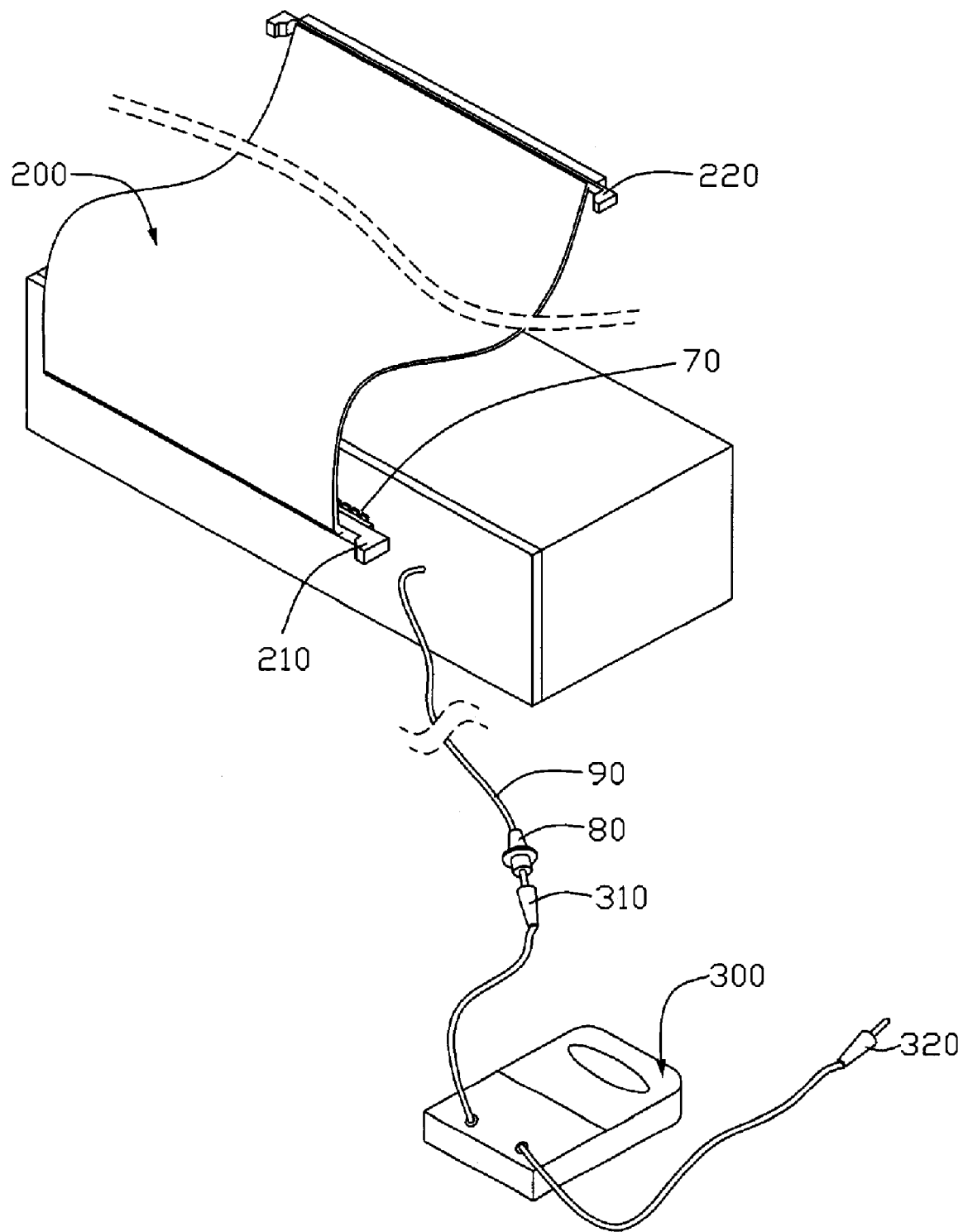
FIG. 3 is a schematic view of the testing apparatus of FIG. 1, together with a cable to be tested.
Figure 4:
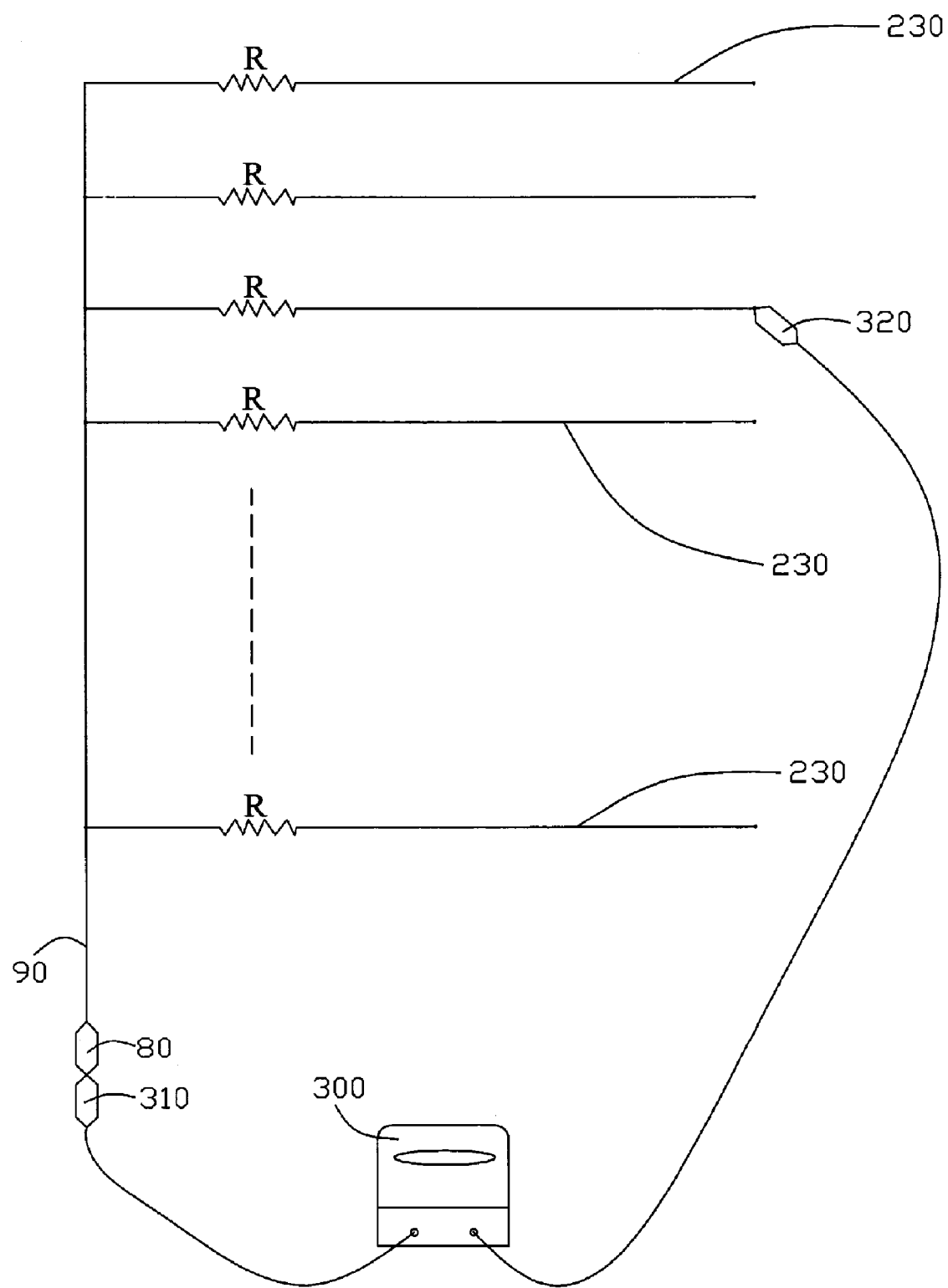
FIG. 4 is a circuit diagram of the testing apparatus of FIG. 3.

Referring to the FIG. 3 and the FIG. 4, a cable 200 to be tested includes a first connector 210, a second connector 220, and a plurality of conductors 230. The first connector 210 and the second connector 220 are electrically connected together via the conductors 230. The first connector 210 is plugged into the interface 70. Thus, the conductors 230 are respectively connected to the resistors R in series. The probe 310 is plugged into the socket 80. Then the probe 320 is touched to one of pins of the second connector 220, and the multi-meter 300 shows a resistance of the conductor 230 corresponding to the pin touched by the probe 320. If the multi-meter 300 shows 10Ω, the conductor 230 is good. If the multi-meter 300 shows infinite, the conductor 230 is open. If the multi-meter 300 shows less than 10Ω, there is a short present between the adjacent conductors 230. In this way, all of the conductors 230 can be tested one by one for both opens and shorts.

Figure 5:
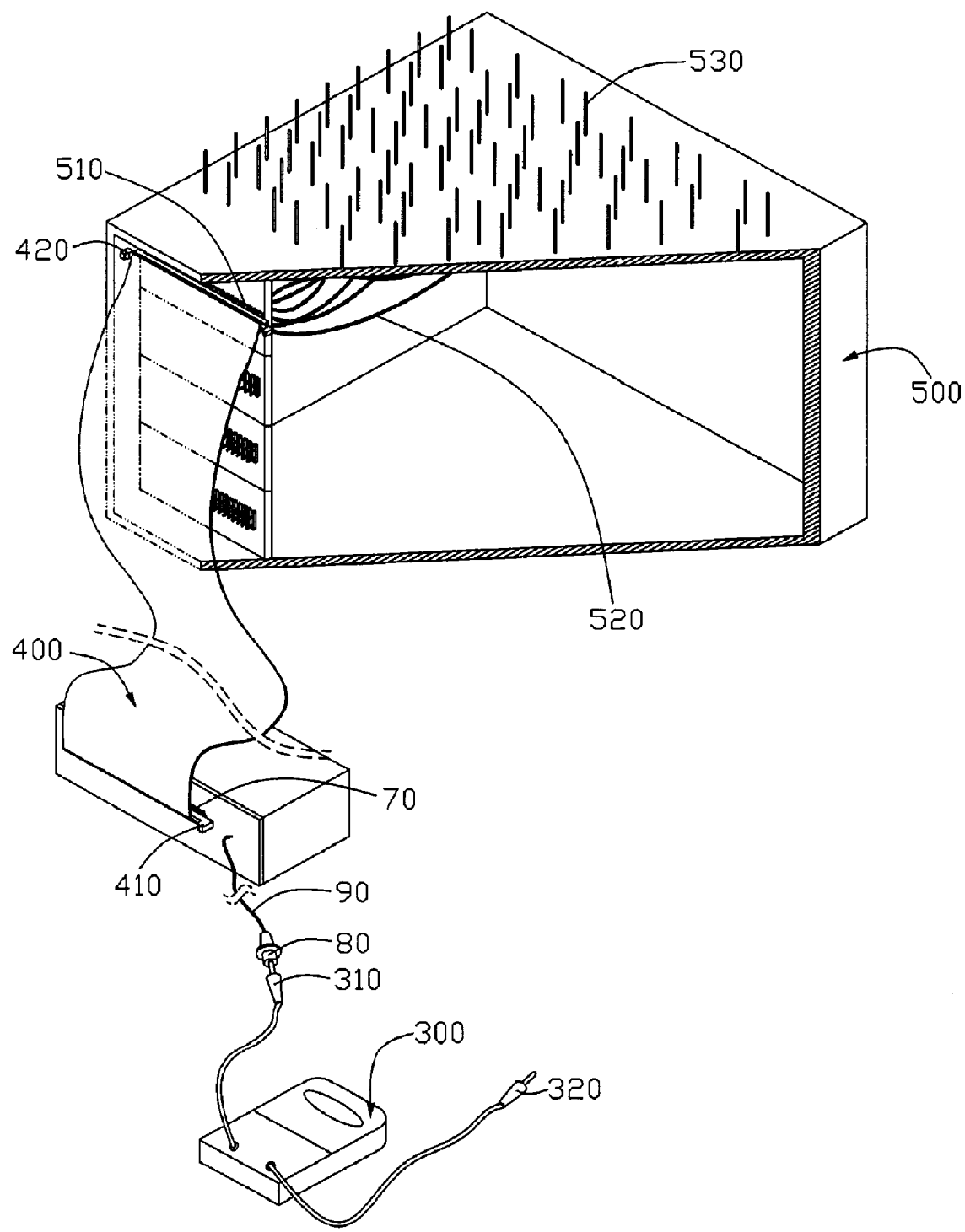
FIG. 5 is a schematic view of the testing apparatus of the preferred embodiment of the present invention, together with the multi-meter, a cable, and an in-circuit test bed-of-nails.

Referring to the FIG. 5, a cable 400 known to have no faults is provided. A bed-of-nails 500 is a device used for in-circuit test (ICT) and can be tested in this embodiment in the same way as testing the cable 200. A first connector 410 of the cable 400 is plugged to the interface 70. A second connector 420 of the cable 400 is plugged to an interface 510 of the bed-of-nails 500. Each wire 520 respectively connects each nail 530 of the bed-of-nails 500 to each pin of the interface 510. Thus, the bed-of-nails 500 is connected to the testing apparatus. Then the probe 310 of the multi-meter 300 is plugged into the socket 80 of the testing apparatus, and the probe 320 of the multi-meter 300 is touched to one of the nails 530 of the bed-of-nails 500. Thus, each wire 520 can be tested one by one for shorts and opens.

In the embodiment, the socket 80 can be defined on the panel 110, and electrically connected to the resistors R.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An apparatus for testing a cable, the cable comprising a first connector, a second connector, and a plurality of conductors between the first and second connectors, the apparatus comprising:

an interface connecting to the first connector of the cable, and comprising a plurality of pins having first ends respectively connecting to the conductors of the cable at the first connectors, and second ends opposing to the first ends;

a plurality of resistors with predetermined resistance having first ends respectively connected to the second ends of the pins of the interface;

a line comprising a first end electrically connected to second ends of the resistors, and a second end; and a meter comprising two probes, one of the probes connected to the second end of the line, the other one of the probes selectively connected to one of the conductors at the second connector of the cable to complete a circuit loop, wherein the meter measures a resistance of the circuit loop which is used to compare with the predetermined resistance of the resistor corresponding to the selected one of the conductors to determine quality of the cable.

2. The apparatus as claimed in claim 1, further comprising a box, wherein the box comprises a panel, the interface is defined on the panel with the first ends of the pins exposed outside of the panel, and the resistors are accommodated in the box, and the second end of the line extends out through the panel.

3. The apparatus as claimed in claim 1, wherein resistances of the resistors are same.

4. An apparatus for testing wires of a bed-of-nails comprising a plurality of nails, the nails connected to first ends of pins of a bed-of-nails interface via the wires, the apparatus comprising:

a cable known to have no faults, comprising a first connector, a second connector, and a plurality of conductors between the first and second connectors, wherein the first connector of the cable is electrically connected to second ends of pins of the bed-of-nails interface;

an interface electrically connected to the second connector of the cable, and comprising a plurality of pins having first ends respectively connecting to the conductors of the cable;

a plurality of resistors with predetermined resistances respectively having first ends respectively connected to second ends of the pins of the interface;

a line comprising a first end electrically connected to second ends of the resistors, and a second end; and a meter comprising two probes, one of the probes connected to the second end of the line, the other one of the probes selectively connected to one of the nails of the bed-of-nails to complete a circuit loop, wherein the meter measures a resistance of the circuit loop, which is used to compare with the predetermined resistance of the resistor corresponding to the selected one of the nails to determine quality of the wires of the bed-of-nails.

5. The apparatus as claimed in claim 4, wherein the meter is a multi-meter.

6. The apparatus as claimed in claim 4, further comprising a box, wherein the box comprises a panel, the interface is defined on the panel with the first ends of the pins exposed outside of the panel and the resistors are accommodated in the box, and the second end of line extends out through the panel.

7. The apparatus claimed in claim 4, wherein the predetermined resistances of the resistors are same.

8. The apparatus claimed in claim 4, wherein the second end of the fine comprises a socket, and one of the probes of the meter is steadily plugged into the socket to connect to the second end of the line.

* * * * *